United States Patent
Cheng (10) Patent No.: US 12,431,904 B1
(45) Date of Patent: Sep. 30, 2025

(54) REDUNDANT TRANSLINEAR CIRCUIT

(71) Applicant: Marvell Asia Pte Ltd, Singapore (SG)

(72) Inventor: Zong Cheng, Shanghai (CN)

(73) Assignee: Marvell Asia Pte Ltd, Singapore (SG)

( * ) Notice: Subject to any disclaimer, the term of this patent is extended or adjusted under 35 U.S.C. 154(b) by 82 days.

(21) Appl. No.: 18/377,687

(22) Filed: Oct. 6, 2023

Related U.S. Application Data (60) Provisional application No. 63/413,908, filed on Oct. 6, 2022.

(51) Int. Cl.
| | | |
|---|---|---|
| *H03K 19/003* | (2006.01) | |
| *H03K 19/007* | (2006.01) | |
| *H03K 19/17728* | (2020.01) | |
| *H03K 19/17736* | (2020.01) | |
| *H03K 19/1776* | (2020.01) | |
| *H03K 19/17796* | (2020.01) | |

(52) U.S. Cl.
CPC . *H03K 19/17728* (2013.01); *H03K 19/17744* (2013.01); *H03K 19/1776* (2013.01); *H03K 19/17796* (2013.01)

(58) Field of Classification Search
None
See application file for complete search history.

(56) References Cited

U.S. PATENT DOCUMENTS

| | | | |
|---|---|---|---|
| 7,408,380 B1 * | 8/2008 | Hassoun | H03K 19/17764 326/38 |
| 8,615,688 B2 | 12/2013 | Yoel | |
| 10,841,013 B2 | 11/2020 | Agazzi | |
| 2006/0270173 A1 | 11/2006 | Yoshihara | |
| 2014/0002195 A1 * | 1/2014 | Pellegrini | H03F 3/45659 330/261 |
| 2015/0137889 A1 * | 5/2015 | Olson | H03F 3/72 330/295 |

OTHER PUBLICATIONS

Kinget et al., "Implications of transistor mismatch on analog circuit design and system performance," available at https://www.ee.columbia.edu/~kinget/papers_files/chapter3.pdf, 1998.

\* cited by examiner

*Primary Examiner* — Anh Q Tran (57) ABSTRACT

An integrated circuit includes current-mode circuitry implemented on a substrate. The current-mode circuitry includes i) a plurality of instances of a translinear circuit, and ii) a plurality of selection circuits coupled to respective instances of the translinear circuit, each selection circuit configured to selectively disable the respective instance of the translinear circuit. The current-mode circuitry is configured to generate a first output using one or more instances of the translinear circuit that are not disabled by one or more respective selection circuits. Drive circuitry is also implemented on the substrate and is coupled to the current-mode circuitry. The drive circuitry is configured to generate a second output using the first output of the current-mode circuitry.

17 Claims, 6 Drawing Sheets

REDUNDANT TRANSLINEAR CIRCUIT

CROSS REFERENCES TO RELATED APPLICATIONS

The present application claims the benefit of U.S. Provisional Patent Application No. 63/413,908, entitled "Redundancy Design on Trans-linear Core in Constant Power/Voltage Control Circuit to Improve Yield and Reliability," filed on Oct. 6, 2022, which is hereby incorporated by reference in its entirety.

FIELD OF TECHNOLOGY

The present disclosure relates generally to integrated circuits (IC), and more particularly to ICs having translinear circuits.

BACKGROUND

The fabrication process for integrated circuit (IC) dies (chips) results in random defects that can adversely affect circuit operation of a subset of chips on a wafer. For example, impurities in materials used, foreign particles introduced during fabrication, variations associated with the mass production/fabrication process, etc., can lead to such defects. If a defect causes a key circuit on an IC chip to malfunction, the entire IC chip may be considered defective.

At least in some cases, bipolar junction transistors (BJTs) are more sensitive to defects than metal-oxide semiconductor (MOS) transistors. Thus, the failure rate of IC chips having BJT transistors may be higher than that of IC chips that only include MOS transistors.

SUMMARY

In an embodiment, a method is for operating an integrated circuit that comprises i) a substrate, ii) current-mode circuitry implemented on the substrate, and iii) drive circuitry implemented on the substrate and coupled to the current-mode circuitry. The current-mode circuitry includes a plurality of instances of a translinear circuit. The method includes: analyzing the plurality of instances of the translinear circuit to identify any instances of the translinear circuit that are defective; in response to identifying one or more instances of the translinear circuit that are defective, disabling the one or more instances of the translinear circuit that are defective using one or more respective selection circuits coupled to the one or more instances of the translinear circuit that are defective; and generating, by the current-mode circuitry, the first output using one or more instances of the translinear circuit. Generating the first output comprises: when one or more instances of the translinear circuit are disabled, generating the first output using one or more instances of the translinear circuit that are not disabled; and when no instances of the translinear circuit are disabled, generating the first output using the plurality of instances of the translinear circuit. The method also includes: generating, by drive circuitry implemented on the substrate and that is coupled to the current-mode circuitry, a second output using the first output of the current-mode circuitry.

In another embodiment, a method for manufacturing an integrated circuit includes: fabricating current-mode circuitry on a substrate, the current-mode circuitry comprising i) a plurality of instances of a translinear circuit, and ii) a plurality of selection circuits coupled to respective instances of the translinear circuit, each selection circuit configured to selectively disable the respective instance of the translinear circuit, wherein the current-mode circuitry is configured to generate a first output using one or more instances of the translinear circuit that are not disabled by one or more respective selection circuits; fabricating drive circuitry on the substrate, the drive circuitry coupled to the current-mode circuitry, the drive circuitry configured to generate a second output using the first output of the current-mode circuitry; determining whether any instances of the translinear circuit, among the plurality of instances of the translinear circuit, are defective; and for each instance of the translinear circuit determined to be defective, controlling the respective selection circuit to disable the instance of the translinear circuit.

In yet another embodiment, an integrated circuit comprises: a substrate; current-mode circuitry implemented on the substrate, the current-mode circuitry comprising i) a plurality of instances of a translinear circuit, and ii) a plurality of selection circuits coupled to respective instances of the translinear circuit, each selection circuit configured to selectively disable the respective instance of the translinear circuit, wherein the current-mode circuitry is configured to generate a first output using one or more instances of the translinear circuit that are not disabled by one or more respective selection circuits; and drive circuitry implemented on the substrate and coupled to the current-mode circuitry, the drive circuitry configured to generate a second output using the first output of the current-mode circuitry.

DETAILED DESCRIPTION

In embodiments described below, an integrated circuit (IC) includes first circuitry implemented on a substrate. The first circuitry includes i) a plurality of instances of second circuitry, and ii) a plurality of selection circuits coupled to respective instances of the second circuitry. Each selection circuit is configured to selectively disable the respective instance of the second circuitry. The first circuitry is configured to generate a first output using one or more instances of the second circuitry that are not disabled by one or more respective selection circuits. The IC also includes fourth circuitry implemented on the substrate and coupled to the first circuitry. The fourth circuitry is configured to generate a second output using the first output of the first circuitry.

In an embodiment, the first circuitry is configured to generate the first output both i) when all of the instances of the second circuitry are not disabled, and ii) when one or more instances of the second circuitry (but not all) are disabled. When one or more instances of the second circuitry are determined to be defective (e.g., because of physical defects introduced during fabrication of the IC), one or more respective selection circuits are used to disable the one or more instances of the second circuitry that are defective, and the first circuitry still generates the first output (when at least one of the instances of the second circuitry is not disabled), according to an embodiment.

ICs having the plurality of instances of the second circuitry such as described above improves manufacturing yield because the probability that any single IC is defective is reduced, at least in some embodiments. For example, even when one or more of the instances of the second circuitry are defective, the first circuitry is operable as long as at least one of the instances of the second circuitry is not defective, according to some embodiments.

A cost of the IC is increased because the plurality of instances of the second circuitry increases physical area as compared to a single instance of the second circuitry. Therefore, in some embodiments, the use of multiple instances of circuitry such as described above is selectively employed for circuitry that is more sensitive to defects, such as defects resulting from a manufacturing process. For example, the use of multiple instances of circuitry is employed for circuitry that include bipolar junction transistors (BJTs), which tend to be more sensitive to defects than metal-oxide semiconductor (MOS) transistors, according to some embodiments. As another example, the use of multiple instances of circuitry is employed for translinear circuits, according to some embodiments. A translinear circuit is a circuit that exploits an exponential current-voltage characteristic of transistors, such as BJT transistors, MOS transistors in weak inversion, etc., to implement a desired function such as multiplication, amplification, and power law relationships.

Figure 1:
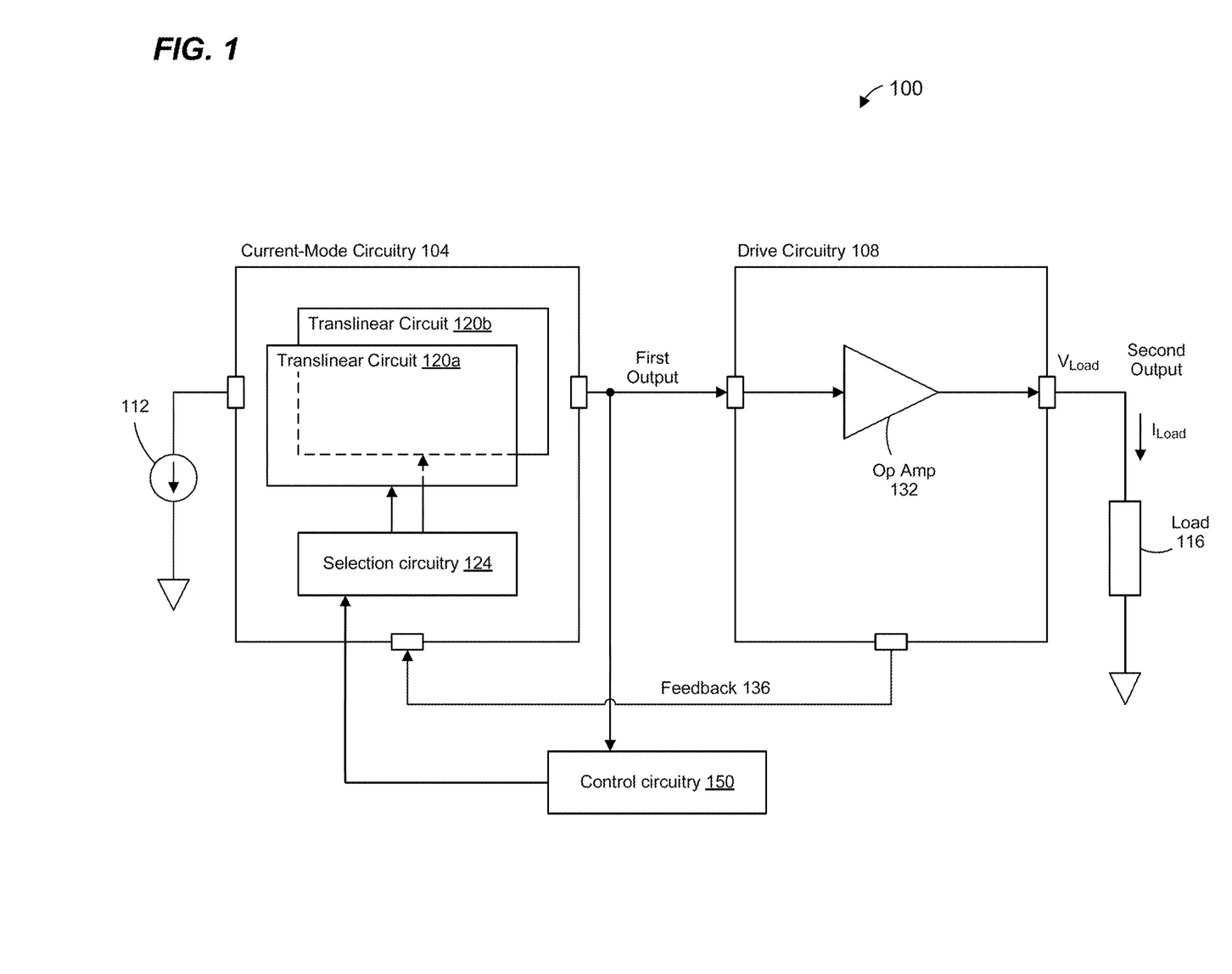
FIG. 1 is a diagram of a portion of an example integrated IC, according to an embodiment.

FIG. 1 is a diagram of a portion 100 of an example IC (sometimes referred to herein as the "IC 100" for brevity), according to an embodiment. The IC 100 includes current-mode circuitry 104 coupled to drive circuitry 108. The current-mode circuitry 104 is also coupled to a current source 112. In an embodiment, the current source 112 is adjustable. An output of the drive circuitry 108 is coupled to a suitable load 116.

The current-mode circuitry 104, the drive circuitry 108, and the current source 112 are implemented on a suitable substrate, according to an embodiment. The load 116 is also implemented on the substrate, according to an embodiment. The load 116 is implemented on another substrate different than the substrate on which the current-mode circuitry 104, the drive circuitry 108, and the current source 112 are implemented, according to another embodiment.

The current-mode circuitry 104 comprises a plurality of instances 120 of a translinear circuit. Although two instances 120 of the translinear circuit are illustrated in FIG. 1, the current-mode circuitry 104 comprises three or more instances 120 of the translinear circuit in other embodiments. In an embodiment, the plurality of instances 120 of the translinear circuit are coupled to the current source 112.

The current-mode circuitry 104 comprises selection circuitry 124 that is coupled to the plurality of instances 120 of the translinear circuit. The selection circuitry 124 is configured to selectively disable one or more instances 120 of the translinear circuit. In an embodiment, the selection circuitry 124 comprises a plurality of selection circuits coupled to respective instances 120 of the translinear circuit, each selection circuit configured to selectively disable the respective instance 120 of the translinear circuit.

The current-mode circuitry 104 is configured to generate a first output using one or more instances 120 of the translinear circuit that are not disabled by the selection circuitry 124. In an embodiment, the current-mode circuitry 108 is configured to: when only a single instance 120 of the translinear circuit is not disabled, generate the first output to correspond to an output of the single instance 120 of the translinear circuit that is not disabled; and when multiple instances of the translinear circuit are not disabled, generate the first output to correspond to an average of respective outputs of the multiple instances 120 of the translinear circuit that are not disabled.

In another embodiment, the current-mode circuitry 104 is additionally or alternatively configured to generate the first output to meet a same set of performance criteria: i) when one or more instances 120 of the translinear circuit are disabled and at least one of the instances 120 of the translinear circuit is not disabled, and ii) when no instances 120 of the translinear circuit are disabled.

Each instance 120 of the translinear circuit is a current multiplier circuit that is configured to generate an output current that corresponds to a product of two input currents, according to an embodiment. Each instance 120 of the translinear circuit is a 2-quadrant squaring circuit that is configured to generate an output current that corresponds to a product of two input currents, where one of the input currents swings positive and negative and another one of the input currents has only one polarity, according to another embodiment. Each instance 120 of the translinear circuit is a squaring circuit that is configured to generate an output current that corresponds to a square of an input current, according to another embodiment.

The drive circuitry 108 includes an operational amplifier 132 that is configured to generate a second output based on the first output from the current-mode circuitry 104. The drive circuitry 108 is configured to generate feedback 136 that is provided to the current-mode circuitry 104, and the current-mode circuitry 104 is configured to generate the first output using the feedback 136.

In an embodiment, the current-mode circuitry 104 is configured to generate the first output as a current signal, and the drive circuitry 108 is configured to generate the second output as a voltage signal. In an embodiment in which the current-mode circuitry 104 generates the first output as a current signal, the drive circuitry 108 converts the first output to a voltage signal, which correspond to the second output.

In an embodiment, the portion 100 of the IC is configured to generate the second output to correspond to a constant voltage signal (i.e., $V_{Load}$ is constant), which is adjustable by adjusting the current generated by the current source 112. In another embodiment, the portion 100 of the IC is configured to generate the second output to correspond to a constant power signal (i.e., $P_{Load}=I_{Load}V_{Load}$ is constant), which is adjustable by adjusting the current generated by the current source 112.

In some embodiments in which the portion 100 of the IC is configured to generate the second output to correspond to a constant voltage signal or a constant power signal, the load 116 includes a heater, such as a heater used for frequency tuning a silicon photonics optical device.

The IC 100 also includes control circuitry 150 that is coupled to the selection circuitry 124. The control circuitry 150 is configured to determine whether one or more instances 120 of the translinear circuit are to be disabled (if any), and to control the selection circuitry 124 to disable one or more instances 120 of the translinear circuit that the control circuitry 150 determines are to be disabled (if any). In an embodiment, the control circuitry 150 generates control signals that control switches of the selection circuitry 124 to disable one or more instances 120 of the translinear circuit that the control circuitry 150 determines are to be disabled (if any).

In an embodiment, the control circuitry 150 is coupled to the first output and analyzes the first output to determine whether one or more instances 120 of the translinear circuit are to be disabled (if any). In another embodiment, the control circuitry 150 is additionally or alternatively coupled to the second output and additionally or alternatively analyzes the second output to determine whether one or more instances 120 of the translinear circuit are to be disabled (if any).

In an embodiment, the control circuitry 150 comprises a processor that executes machine readable instructions stored in a memory coupled to the processor. The machine readable instructions, when executed by the processor, cause the processor to one or more of: i) generate control signals that control switches of the selection circuitry 124, ii) analyze the first output to determine whether one or more instances 120 of the translinear circuit are to be disabled, and iii) analyze the second output to determine whether one or more instances 120 of the translinear circuit are to be disabled.

In another embodiment, the control circuitry 150 additionally or alternatively comprises hardware circuitry (such as a hardware state machine and/or other suitable circuitry) that is configured to perform one or more of: i) generate control signals that control switches of the selection circuitry 124, ii) analyze the first output to determine whether one or more instances 120 of the translinear circuit are to be disabled, and iii) analyze the second output to determine whether one or more instances 120 of the translinear circuit are to be disabled.

In another embodiment, the control circuitry does not determine whether one or more instances 120 of the translinear circuit are to be disabled. Rather, a device separate from the IC 100 (e.g., a test fixture) determine whether one or more instances 120 of the translinear circuit are to be disabled by analyzing the first output and/or the second output.

Figure 2:
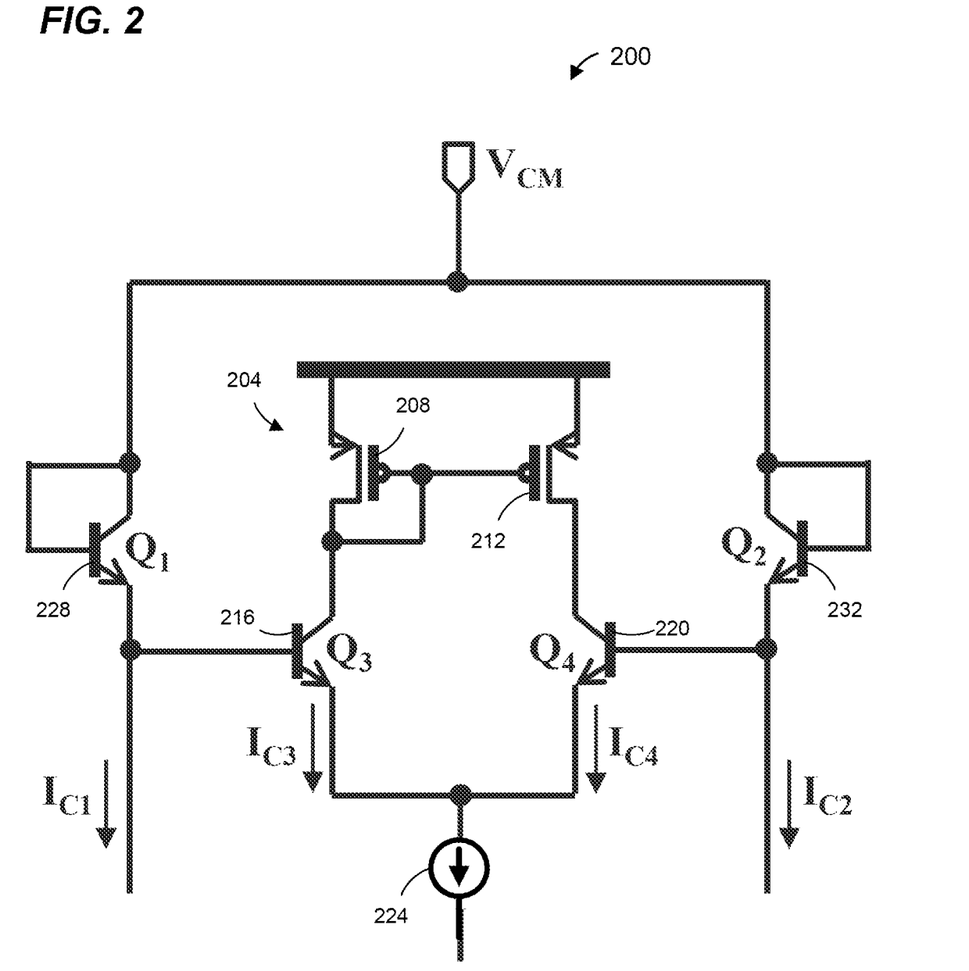
FIG. 2 is a simplified circuit diagram of an example translinear circuit included in the IC of FIG. 1, according to an embodiment.

FIG. 2 is a simplified circuit diagram of an example translinear circuit 200, according to an embodiment. Referring now to FIGS. 1 and 2, each instance 120 of the translinear circuit in the current-mode circuitry 104 corresponds to the translinear circuit 200, according to an embodiment. In another embodiment, each instance 120 of the translinear circuit in the current-mode circuitry 104 corresponds to another suitable translinear circuit different than the translinear circuit 200. Similarly, the translinear circuit 200 is used in another suitable IC different than the IC 100, in other embodiments.

The translinear circuit 200 includes a current mirror 204 having a p-channel MOS (PMOS) transistor 208 and a PMOS transistor 212. A source of the PMOS transistor 208 and a source of the PMOS transistor 212 are coupled to a reference voltage. A gate of the PMOS transistor 208 is coupled to a drain of the PMOS transistor 208. The gate of the PMOS transistor 208 is also coupled to a gate of the PMOS transistor 212.

The current mirror 204 is coupled to a BJT transistor 216 ($Q_3$) and a BJT transistor 220 ($Q_4$). For example, the drain of the PMOS transistor 208 is coupled to a collector of $Q_3$, and the drain of the PMOS transistor 212 is coupled to a collector of $Q_4$. An emitter of $Q_3$ is coupled to a current source 224, and a collector of $Q_4$ is coupled to the current source 224.

A collector of a BJT transistor 228 ($Q_1$) and a collector of a BJT transistor 232 ($Q_2$) are coupled to a reference voltage. A base of $Q_1$ is coupled to the collector of $Q_1$, and a base of $Q_2$ is coupled to the collector of $Q_2$. An emitter of $Q_1$ is coupled to a base of $Q_3$, and an emitter of $Q_2$ is coupled to a base of $Q_4$.

A current relationship for an NPN BJT transistor can be modeled as:

$$I_c = I_s \exp\frac{V_{be}}{V_T} \qquad \text{Equation 1}$$

where $I_C$ is a collector current of the NPN BJT transistor, $I_S$ is a saturation current of the NPN BJT transistor, $V_{be}$ is a base-emitter voltage of the NPN BJT transistor, and VT is a thermal voltage of the NPN BJT transistor. Equation 1 can be rewritten as:

$$V_{be} = V_T \ln\left(\frac{I_c}{I_s}\right) \qquad \text{Equation 2}$$

In the translinear circuit 200, the following relationship holds:

$$V_{be1}+V_{be3}=V_{be2}+V_{be4} \qquad \text{Equation 3}$$

Combining equations 2 and 3 and assuming $V_T$ is the same for transistors $Q_1$, $Q_2$, $Q_3$, and $Q_4$, we have:

$$V_T\ln\left(\frac{I_{C1}}{I_S}\right) + V_T\ln\left(\frac{I_{C3}}{I_S}\right) = V_T\ln\left(\frac{I_{C2}}{I_S}\right) + V_T\ln\left(\frac{I_{C4}}{I_S}\right) \qquad \text{Equation 4}$$

which can be rewritten as:

$$I_{c1}I_{c3}=I_{c2}I_{c4} \qquad \text{Equation 5}$$

which corresponds to a current multiplication.

In an embodiment, the translinear circuit 200 is coupled with a selection circuit (not shown) to selectively disable the translinear circuit 200.

Figure 3:
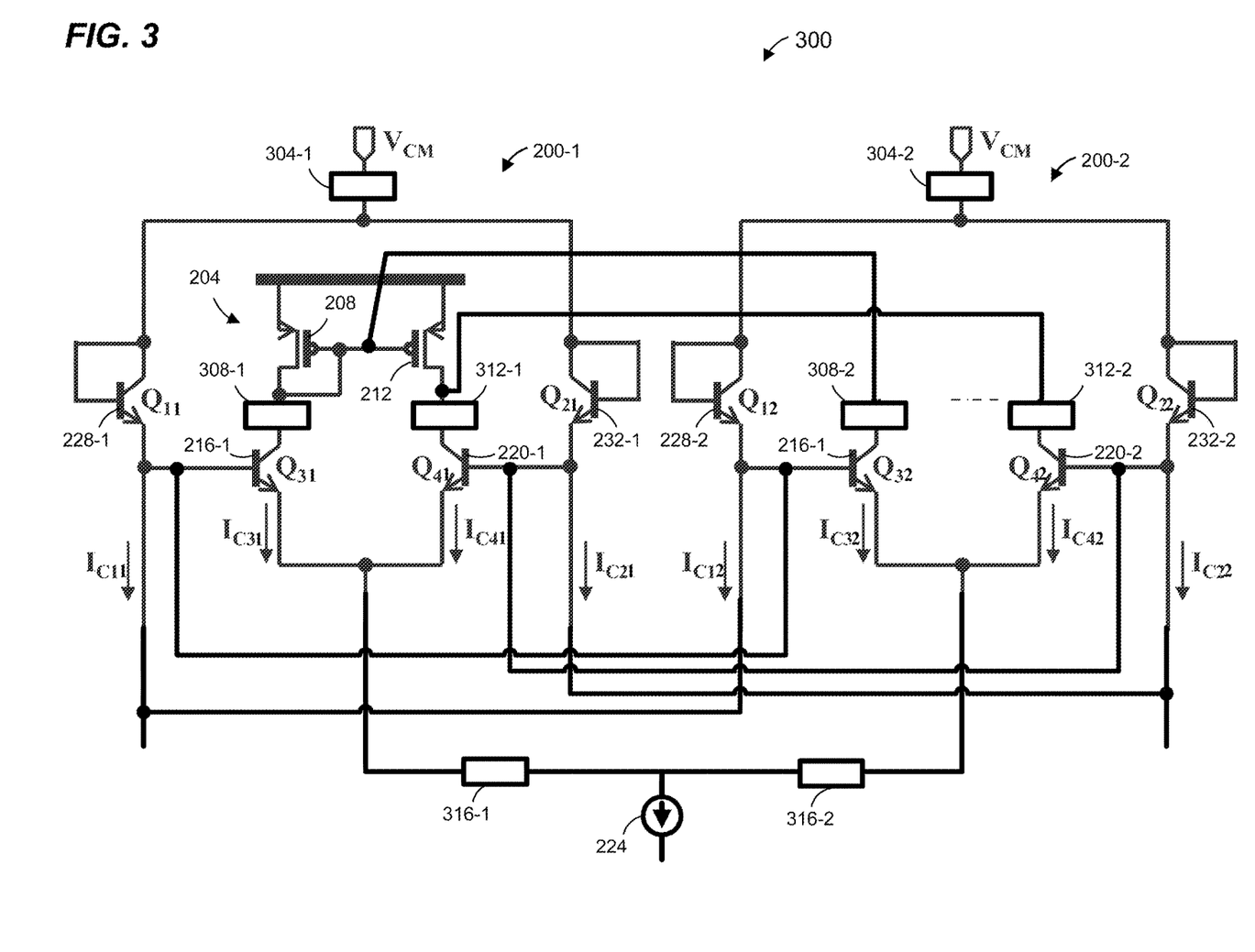
FIG. 3 is a simplified diagram of an example circuit that corresponds to multiple instances of a translinear circuit, such as the translinear circuit of FIG. 2, according to an embodiment.

FIG. 3 is a simplified diagram of an example circuit 300 that corresponds to multiple instances of a translinear circuit, such as the translinear circuit 200 of FIG. 2, coupled to selection circuitry, according to an embodiment. Referring now to FIGS. 1 and 3, the circuit 300 corresponds to the multiple instances 120 of the translinear circuit and the selection circuitry 124, according to an embodiment. In another embodiment, the multiple instances 120 of the translinear circuit corresponds to other suitable circuitry different than the circuit 300. Similarly, the circuit 300 is used in another suitable IC different than the IC 100, in other embodiments.

The circuit 300 includes two instances of the translinear circuit 200 that share the current source 204 and the current source 224. In particular, the collectors of transistors $Q_{31}$, $Q_{41}$, $Q_{32}$, and $Q_{42}$ are coupled to the current source 204, and the emitters of transistors $Q_{31}$, $Q_{41}$, $Q_{32}$, and $Q_{42}$ are coupled to the current source 224. As will be described further below, when both instances of the translinear circuit 200 are enabled (i.e., not disabled), current from the current source 204 is distributed between both translinear circuits 200, and current from the current source 224 is distributed between both translinear circuits 200. When only one instance 200 of the translinear circuit is enabled, current from the current source 204 is provided to the one instance 200 of the translinear circuit that is enabled, and current from the current source 224 is provided to the one instance 200 of the translinear circuit that is enabled.

A collector of the transistor $Q_{31}$ is coupled to a collector of the transistor $Q_{32}$, and a collector of the transistor $Q_{41}$ is coupled to a collector of the transistor $Q_{42}$. A base of the transistor $Q_{31}$ is coupled to a base of the transistor $Q_{32}$, and a base of the transistor $Q_{41}$ is coupled to a base of the transistor $Q_{42}$.

In an embodiment, the first output of the current-mode circuitry 104 corresponds to the collector of the transistor $Q_{41}$.

The circuit comprise a plurality of switches that are used to selectively disable instances 200 of the translinear circuit. For example, switch 304-1 selectively couples the transistors $Q_{11}$ and $Q_{21}$ to the reference voltage, and switch 304-2 selectively couples the transistors $Q_{12}$ and $Q_{22}$ to the reference voltage. Switch 308-1 selectively couples the transistor $Q_{31}$ to the current mirror 204, and switch 308-2 selectively couples the transistor $Q_{32}$ to the current mirror 204. Switch 312-1 selectively couples the transistor $Q_{41}$ to the current mirror 204, and switch 312-2 selectively couples the transistor $Q_{42}$ to the current mirror 204. Switch 316-1 selectively couples transistors $Q_{31}$ and $Q_{41}$ to the current mirror 224, and switch 316-2 selectively couples transistors $Q_{32}$ and $Q_{42}$ to the current mirror 224.

The switches 304-1, 308-1, 312-1, and 316-1 correspond to a first selection circuit for selectively disabling the translinear circuit 200-1, and the switches 304-2, 308-2, 312-2, and 316-2 correspond to a second selection circuit for selectively disabling the translinear circuit 200-2, according to an embodiment. For example, when the translinear circuit 200-1 is to be disabled: the switch 304-1 is set to isolate the transistors $Q_{11}$ and $Q_{21}$ from the reference voltage; the switch 308-1 is set to isolate the transistor $Q_{31}$ from the current mirror 204; the switch 312-1 is set to isolate the transistor $Q_{41}$ from the current mirror 204; and the switch 316-1 is set to isolate the transistors $Q_{31}$ and $Q_{41}$ from the current mirror 224. When the translinear circuit 200-1 is to be enabled: the switch 304-1 is set to couple the transistors $Q_{11}$ and $Q_{21}$ to the reference voltage; the switch 308-1 is set to couple the transistor $Q_{31}$ to the current mirror 204; the switch 312-1 is set to couple the transistor $Q_{41}$ to the current mirror 204; and the switch 316-1 is set to couple the transistors $Q_{31}$ and $Q_{41}$ to the current mirror 224.

Similarly, when the translinear circuit 200-2 is to be disabled: the switch 304-2 is set to isolate the transistors $Q_{12}$ and $Q_{22}$ from the reference voltage; the switch 308-2 is set to isolate the transistor $Q_{32}$ from the current mirror 204; the switch 312-2 is set to isolate the transistor $Q_{42}$ from the current mirror 204; and the switch 316-2 is set to isolate the transistors $Q_{32}$ and $Q_{42}$ from the current mirror 224. When the translinear circuit 200-2 is to be enabled: the switch 304-2 is set to couple the transistors $Q_{12}$ and $Q_{22}$ to the reference voltage; the switch 308-2 is set to couple the transistor $Q_{32}$ to the current mirror 204; the switch 312-2 is set to couple the transistor $Q_{42}$ to the current mirror 204; and the switch 316-2 is set to couple the transistors $Q_{32}$ and $Q_{42}$ to the current mirror 224.

In operation, when the translinear circuit 200-1 is determined to be operational and the translinear circuit 200-1 is determined to be defective: the switch 304-1 is set to couple the transistors $Q_{11}$ and $Q_{21}$ to the reference voltage; the switch 308-1 is set to couple the transistor $Q_{31}$ to the current mirror 204; the switch 312-1 is set to couple the transistor $Q_{41}$ to the current mirror 204; the switch 316-1 is set to couple the transistors $Q_{31}$ and $Q_{41}$ to the current mirror 224; the switch 304-2 is set to isolate the transistors $Q_{12}$ and $Q_{22}$ from the reference voltage; the switch 308-2 is set to isolate the transistor $Q_{32}$ from the current mirror 204; the switch 312-2 is set to isolate the transistor $Q_{42}$ from the current mirror 204; and the switch 316-2 is set to isolate the transistors $Q_{32}$ and $Q_{42}$ from the current mirror 224. In this configuration, the first output of the current-mode circuitry 104 corresponds to an output of the translinear circuit 200-1.

On the other hand, when the translinear circuit 200-1 is determined to be defective and the translinear circuit 200-1 is determined to be operational: the switch 304-1 is set to isolate the transistors $Q_{11}$ and $Q_{21}$ from the reference voltage; the switch 308-1 is set to isolate the transistor $Q_{31}$ from the current mirror 204; the switch 312-1 is set to isolate the transistor $Q_{41}$ from the current mirror 204; the switch 316-1 is set to isolate the transistors $Q_{31}$ and $Q_{41}$ from the current mirror 224; the switch 304-2 is set to couple the transistors $Q_{12}$ and $Q_{22}$ to the reference voltage; the switch 308-2 is set to couple the transistor $Q_{32}$ to the current mirror 204; the switch 312-2 is set to couple the transistor $Q_{42}$ to the current mirror 204; and the switch 316-2 is set to couple the transistors $Q_{32}$ and $Q_{42}$ to the current mirror 224. In this configuration, the first output of the current-mode circuitry 104 corresponds to an output of the translinear circuit 200-2.

When both translinear circuits 200 are determined to be operational: the switch 304-1 is set to couple the transistors $Q_{11}$ and $Q_{21}$ to the reference voltage; the switch 308-1 is set to couple the transistor $Q_{31}$ to the current mirror 204; the switch 312-1 is set to couple the transistor $Q_{41}$ to the current mirror 204; the switch 316-1 is set to couple the transistors $Q_{31}$ and $Q_{41}$ to the current mirror 224; the switch 304-2 is set to couple the transistors $Q_{12}$ and $Q_{22}$ to the reference voltage; the switch 308-2 is set to couple the transistor $Q_{32}$ to the current mirror 204; the switch 312-2 is set to couple the transistor $Q_{42}$ to the current mirror 204; and the switch 316-2 is set to couple the transistors $Q_{32}$ and $Q_{42}$ to the current mirror 224. In this configuration, the first output of the current-mode circuitry 104 corresponds to an average of the output of the translinear circuit 200-1 and the output of the translinear circuit 200-2.

In an embodiment, one or more of the switches 304, 308, 312, and 316 comprise transistors that permit the one or more of the switches 304, 308, 312, and 316 to be reset as desired. For example, the one or more of the switches 304, 308, 312, and 316 can be set and reset multiple times during a manufacturing and/or testing process and/or during operation "in the field", according to an embodiment. In various embodiments, one or more of the switches 304, 308, 312, and 316 additionally or alternatively comprise fuses, antifuses, electronic fuses (e-fuses), etc., that permit the one or more of the switches 304, 308, 312, and 316 to be set permanently or semi-permanently. For example, the one or more of the switches 304, 308, 312, and 316 can be set permanently or semi-permanently as part of a manufacturing and/or testing process, according to an embodiment.

In various other embodiments, one or more of the switches 304, 308, 312, and 316 are omitted and/or one or more other switches are added in one more suitable locations in the translinear circuit 200 to selectively disable the translinear circuit 200.

Figure 4:
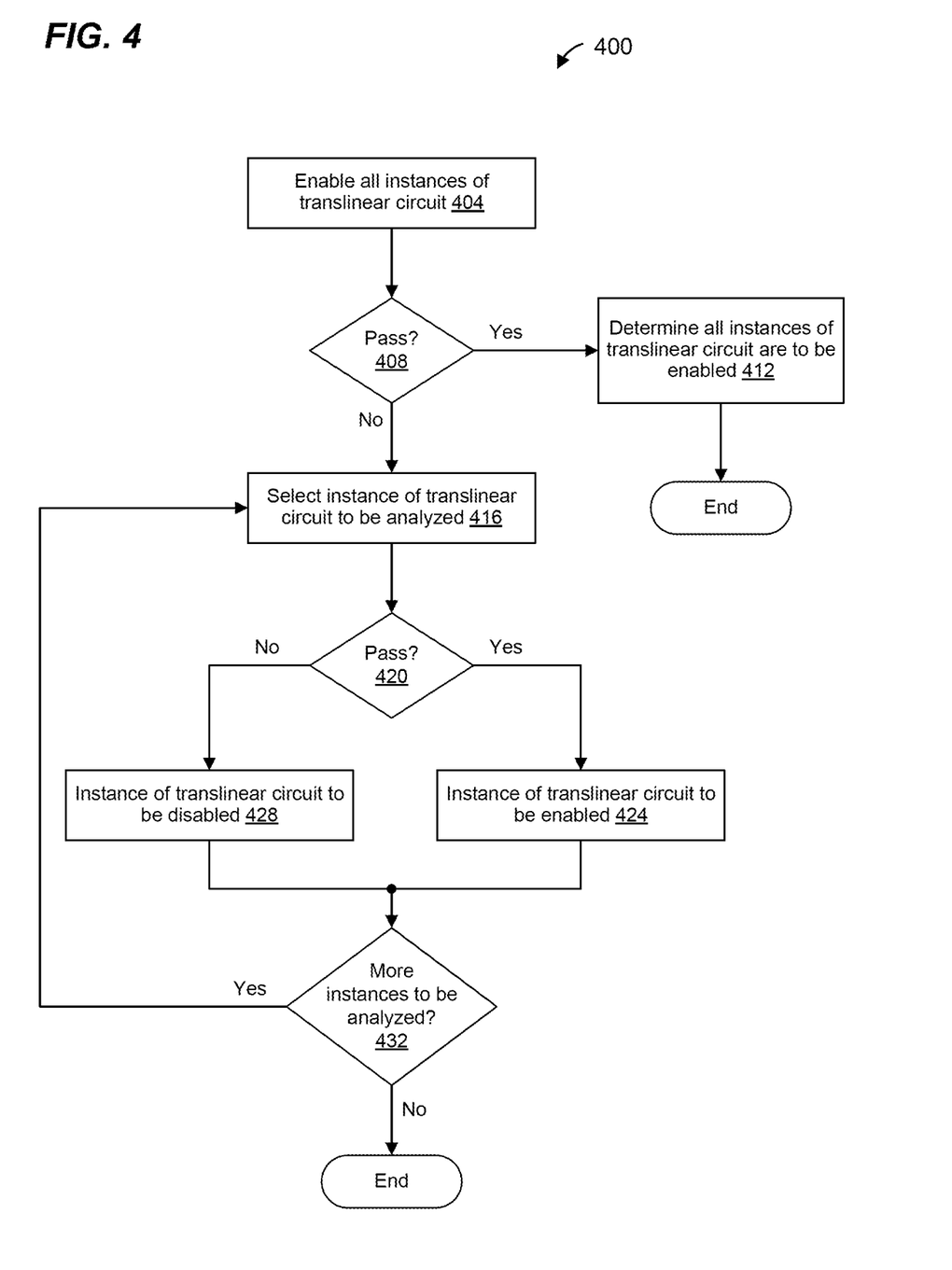
FIG. 4 is a flow diagram of an example method for determining whether one or more instances (if any) of a circuit of an IC are to be disabled, according to an embodiment.

FIG. 4 is a flow diagram of an example method 400 for determining whether one or more instances (if any) of a translinear circuit of an IC are to be disabled, according to an embodiment. In an embodiment, the method 400 is performed in conjunction with an IC such as the example IC 100 of FIG. 1 and/or with a circuit such as the circuit 300 of FIG. 3, and the method 400 is described with references to FIGS. 1 and 3 merely for explanatory purposes. In other embodiments, the method 400 is performed in conjunction with another suitable IC different than the IC 100 and/or another suitable circuit different than the circuit 300. Similarly, in other embodiments, a suitable method different than the method 400 is used to determine one or more instances 120 (if any) of the translinear circuit of FIG. 1 that are to be disabled, and/or to determine one or more instances 200 (if any) of the translinear circuit of FIG. 3 that are to be disabled.

At block 404, all instances of the translinear circuit are enabled. For example, control circuitry, such as the control circuitry 150, controls selection circuitry, such as the selection circuitry 124, to enable all instances of the translinear circuit, according to an embodiment. As another example, a device separate from the IC, such as a test fixture used as part of a manufacturing process and/or a testing process, controls selection circuitry, such as the selection circuitry 124, to enable all instances of the translinear circuit, according to an embodiment.

At block 408, it is determined whether operation of the IC meets a set of one or more performance criteria when all instances of the translinear circuit are enabled. For example, the first output of the current-mode circuitry 104 is analyzed to determine whether the first output meets the set of one or more performance criteria, according to an embodiment. As another example, the second output of the drive circuitry 108 is analyzed to determine whether the second output meets the set of one or more performance criteria, according to another embodiment. As another example, the first output of the current-mode circuitry 104 and the second output of the drive circuitry 108 are analyzed to determine whether the first output and the second output meet the set of one or more performance criteria, according to another embodiment.

In an embodiment, control circuitry of the IC, such as the control circuitry 150, performs block 408, at least partially. As another example, a device separate from the IC, such as a test fixture used as part of a manufacturing process and/or a testing process, performs block 408, at least partially.

In response to determining at block 408 that operation of the IC meets the set of one or more performance criteria when all instances of the translinear circuit are enabled, the flow proceeds to block 412. At block 412, it is determined that all instances of the translinear circuit are to be enabled for operation of the IC. In an embodiment, control circuitry of the IC, such as the control circuitry 150, performs block 412, at least partially. As another example, a device separate from the IC, such as a test fixture used as part of a manufacturing process and/or a testing process, performs block 412, at least partially.

On the other hand, in response to determining at block 408 that operation of the IC does not meet the set of one or more performance criteria when all instances of the translinear circuit are enabled, the flow proceeds to block 416. At block 416, one instance of the translinear circuit is enabled and one or more other instances of the translinear circuit are disabled. For example, control circuitry, such as the control circuitry 150, controls selection circuitry, such as the selection circuitry 124, to enable one instance of the translinear circuit and to disable one or more other instances of the translinear circuit, according to an embodiment. As another example, a device separate from the IC, such as a test fixture used as part of a manufacturing process and/or a testing process, controls selection circuitry, such as the selection circuitry 124, to enable one instance of the translinear circuit and to disable one or more other instances of the translinear circuit, according to another embodiment.

At block 420, it is determined whether operation of the IC meets the set of one or more performance criteria when the one instance of the translinear circuit is enabled and the one or more other instances of the translinear circuit are disabled. For example, the first output of the current-mode circuitry 104 is analyzed to determine whether the first output meets the set of one or more performance criteria, according to an embodiment. As another example, the second output of the drive circuitry 108 is analyzed to determine whether the second output meets the set of one or more performance criteria, according to another embodiment. As another example, the first output of the current-mode circuitry 104 and the second output of the drive circuitry 108 are analyzed to determine whether the first output and the second output meet the set of one or more performance criteria, according to another embodiment.

In an embodiment, control circuitry of the IC, such as the control circuitry 150, performs block 420, at least partially. As another example, a device separate from the IC, such as a test fixture used as part of a manufacturing process and/or a testing process, performs block 420, at least partially.

In response to determining at block 420 that operation of the IC meets the set of one or more performance criteria when the one instance of the translinear circuit is enabled and the one or more other instances of the translinear circuit are disabled, the flow proceeds to block 424. At block 424, it is determined that the one instance of the translinear circuit is to be enabled for operation of the IC. In an embodiment, control circuitry of the IC, such as the control circuitry 150, performs block 424, at least partially. As another example, a device separate from the IC, such as a test fixture used as part of a manufacturing process and/or a testing process, performs block 424, at least partially.

On the other hand, in response to determining at block 420 that operation of the IC does not meet the set of one or more performance criteria when the one instance of the translinear circuit is enabled and the one or more other instances of the translinear circuit are disabled, the flow proceeds to block 428. At block 428, it is determined that the one instance of the translinear circuit is to be disabled for operation of the IC. In an embodiment, control circuitry of the IC, such as the control circuitry 150, performs block 428, at least partially. As another example, a device separate from the IC, such as a test fixture used as part of a manufacturing process and/or a testing process, performs block 428, at least partially.

After blocks 424 and 428, the flow proceeds to block 432. At block 432, it is determined whether there are any further instances of the translinear circuit that are to be analyzed. In an embodiment, control circuitry of the IC, such as the control circuitry 150, performs block 432, at least partially. As another example, a device separate from the IC, such as a test fixture used as part of a manufacturing process and/or a testing process, performs block 432, at least partially.

If it is determined at block 432 that one or more other instances of the translinear circuit are to be analyzed, the flow proceeds back to block 416, at which another instance of the translinear circuit is enabled and one or more other instances of the translinear circuit are disabled. In this manner, blocks 416-432 are repeated until all instances of the translinear circuit have been analyzed.

If it is determined at block 432 that no further instances of the translinear circuit are to be analyzed, the flow ends.

In other embodiments, the method 400 is used in conjunction with a suitable circuit that is not a translinear circuit and/or with suitable first circuitry that is not current mode circuitry and/or with suitable second circuitry that is not drive circuitry.

Figure 5:
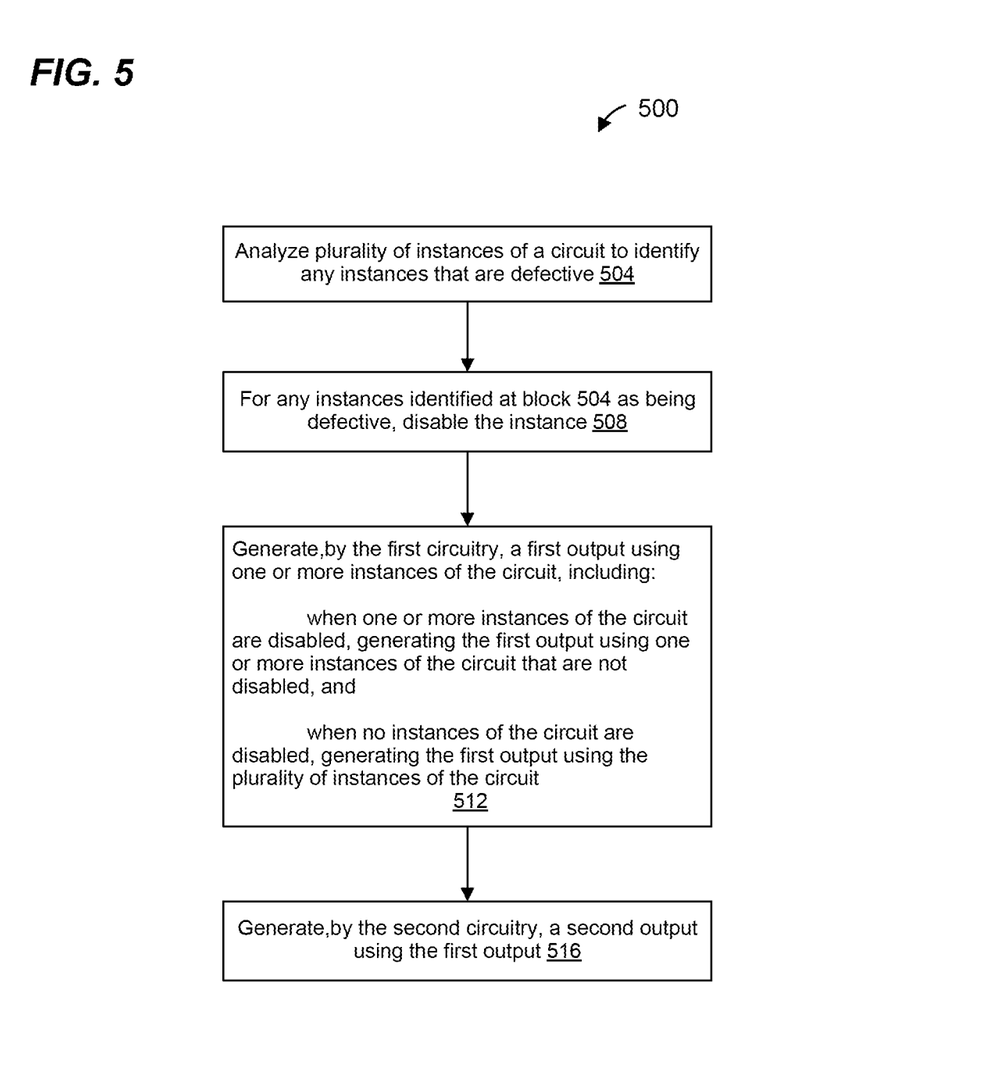
FIG. 5 is a flow diagram of an example method for operating an IC, according to an embodiment.

FIG. 5 is a flow diagram of an example method 500 for operating an IC, according to an embodiment, wherein the IC includes i) a substrate, ii) first circuitry implemented on the substrate, the first including a plurality of instances of a circuit, and iii) second circuitry implemented on the substrate and coupled to the first circuitry. In an embodiment, the method 500 is performed in conjunction with an IC such as the example IC 100 of FIG. 1 and/or with a circuit such as the circuit 300 of FIG. 3, and the method 500 is described with references to FIGS. 1 and 3 merely for explanatory purposes. In other embodiments, the method 500 is performed in conjunction with another suitable IC different than the IC 100 and/or another suitable circuit different than the circuit 300. Similarly, in other embodiments, the IC 100 and/or the circuit 300 operates according to another suitable method different than the method 500.

At block 504, the plurality of instances of the circuit are analyzed to identify any instances of the circuit that are defective. In some embodiments, block 504 includes performing the method 400 of FIG. 4. In other embodiments, block 504 includes performing another suitable method different than the method 400 of FIG. 4.

At block 508, any instances identified at block 504 as being defective are disabled. In an embodiment in which the IC corresponds to the IC 100, the control circuitry 150 disables any instances identified at block 504 as being defective. In another embodiment in which the IC corresponds to the IC 100, manufacturing and/or testing equipment disables any instances identified at block 504 as being defective. Disabling the one or more instances of the circuit that are defective at block 508 includes using one or more respective selection circuits coupled to the one or more instances of the circuit, according to an embodiment. Block 508 includes using selection circuitry such as the selection circuitry 124 to disable any instances identified at block 504 as being defective, according to an embodiment. In an embodiment, disabling the one or more instances of the circuit that are defective at block 508 comprises: controlling, by logic circuitry coupled to a plurality of selection circuits, the plurality of selection circuits to selectively disable respective instances of the circuit.

At block 512, the first circuitry generates a first output using one or more instances of the circuit, including: when one or more instances of the circuit are disabled, generating the first output using one or more instances of the circuit that are not disabled; and when no instances of the circuit are disabled, generating the first output using the plurality of instances of the circuit. In an embodiment, the first circuitry includes the current-mode circuitry 104. In another embodiment, the first circuitry additionally or alternatively includes the circuit 300.

In another embodiment, generating the first output at block 512 comprises: when only one instance of the circuit is not disabled, generating the first output to correspond to only a single instance of the circuit that is not disabled; and when multiple instances of the circuit are not disabled, generating the first output to correspond to an average of respective outputs of the multiple instances of the circuit that are not disabled.

In another embodiment, generating the first output at block 512 comprises: generating the first output to meet a same set of performance criteria, including: generating the first output to meet the same set of performance criteria when one or more instances of the circuit are disabled and at least one of the instances of the circuit is not disabled; and generating the first output to meet the same set of performance criteria when no instances of the circuit are disabled.

In another embodiment in which the first circuitry comprises a current source coupled to the plurality of instances of the circuit: disabling the one or more instances of the circuit that are defective at block 508 comprises isolating the one or more instances of the circuit that are defective from the current source; and generating the first output at block 512 comprises distributing a current output by the current source among one or more instances of the circuit that are connected to the current source by one or more respective selection circuits.

At block 516, the second circuitry generates a second output using the first output of the first circuitry. In an embodiment, the second circuitry includes the drive circuitry 108.

Figure 6:
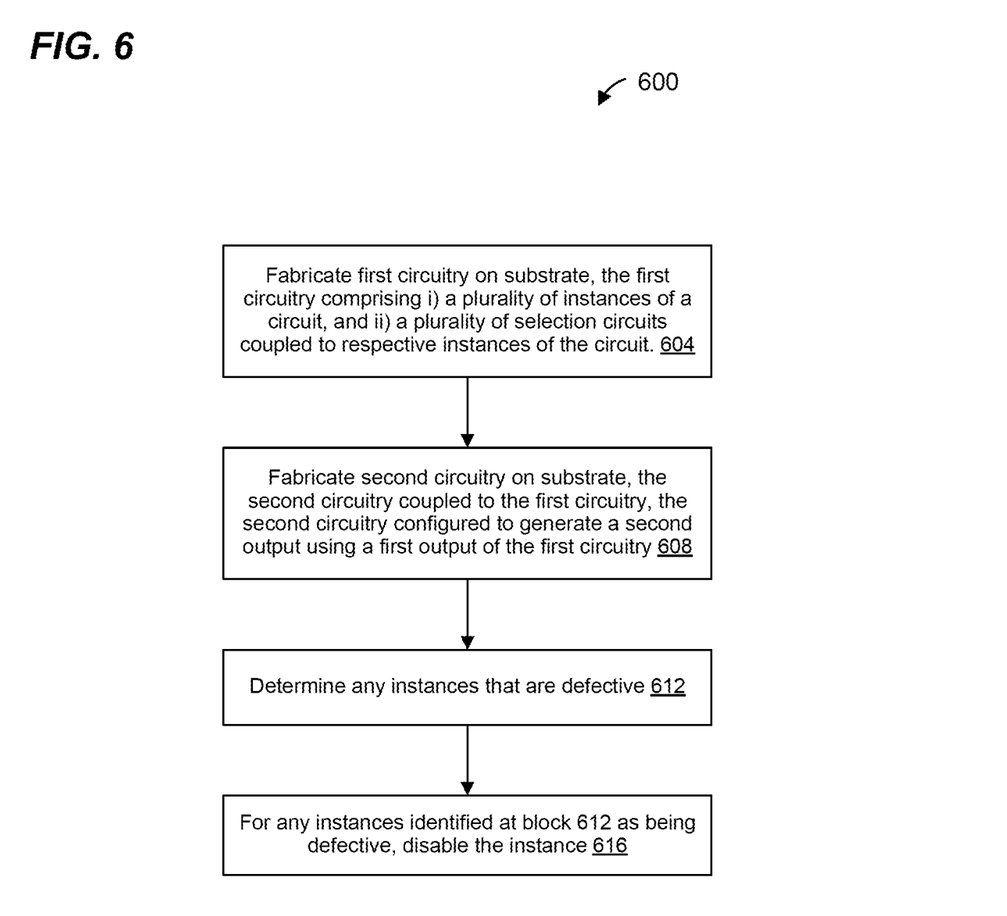
FIG. 6 is a flow diagram of an example method for fabricating an IC, according to an embodiment.

FIG. 6 is a flow diagram of an example method 600 for fabricating an IC, according to an embodiment. In an embodiment, the method 600 is performed in conjunction with an IC such as the example IC 100 of FIG. 1 and/or with a circuit such as the circuit 300 of FIG. 3, and the method 600 is described with references to FIGS. 1 and 3 merely for explanatory purposes. In other embodiments, the method 600 is performed in conjunction with another suitable IC different than the IC 100 and/or another suitable circuit different than the circuit 300. Similarly, in other embodiments, the IC 100 and/or the circuit 300 are fabricated according to another suitable method different than the method 600.

At block 604, first circuitry is fabricated on a substrate, the first circuitry comprising i) a plurality of instances of a circuit, and ii) a plurality of selection circuits coupled to respective instances of the circuit. Each selection circuit is configured to selectively disable the respective instance of the circuit, according to an embodiment. The first circuitry is configured to generate a first output using one or more instances of the circuit that are not disabled by one or more respective selection circuits, in an embodiment. In an embodiment, the first circuitry comprises the current-mode circuitry 104. In another embodiment, the first circuitry additionally or alternatively comprises the circuit 300.

In another embodiment, the first circuitry is configured to: when only one instance of the circuit is not disabled, generate the first output to correspond to only a single instance of the circuit that is not disabled; and when multiple instances of the circuit are not disabled, generate the first output to correspond to an average of respective outputs of the multiple instances of the circuit that are not disabled.

In another embodiment, the first circuitry is configured to: generate the first output to meet a same set of performance criteria, including: generating the first output to meet the same set of performance criteria when one or more instances of the circuit are disabled and at least one of the instances of the circuit is not disabled; and generating the first output to meet the same set of performance criteria when no instances of the circuit are disabled.

At block 608, second circuitry is fabricated on the substrate, the second circuitry coupled to the first circuitry, the second circuitry configured to generate a second output using the first output of the first circuitry. In an embodiment, the second circuitry comprises the drive circuitry 108.

At block 612, it is determined whether any instances of the circuit are defective. In some embodiments, block 612 includes performing the method 400 of FIG. 4. In other embodiments, block 612 includes performing another suitable method different than the method 400 of FIG. 4.

At block 616, any instances determined at block 612 to be defective are disabled. In an embodiment in which the IC corresponds to the IC 100, the control circuitry 150 disables any instances identified at block 612 as being defective. In another embodiment in which the IC corresponds to the IC 100, manufacturing and/or testing equipment disables any instances identified at block 612 as being defective. Disabling the one or more instances of the circuit that are determined to be defective at block 612 includes using one or more respective selection circuits coupled to the one or more instances of the circuit, according to an embodiment. Block 616 includes using selection circuitry such as the selection circuitry 124 to disable any instances determined at block 612 to be defective, according to an embodiment. In an embodiment, disabling the one or more instances of the circuit that are defective at block 616 comprises: controlling, by logic circuitry coupled to a plurality of selection circuits, the plurality of selection circuits to selectively disable respective instances of the circuit.

In an embodiment in which the first circuitry comprises a current source coupled to the plurality of instances of the circuit: disabling the one or more instances of the circuit that are defective at block 616 comprises isolating the one or more instances of the circuit that are defective from the current source; and the first circuitry is configured to distribute a current output by the current source among one or more instances of the circuit that are connected to the current source by one or more respective selection circuits.

At least some of the various blocks, operations, and techniques described above may be implemented utilizing hardware, a processor executing firmware instructions, a processor executing software instructions, or any combination thereof. When implemented utilizing a processor executing software or firmware instructions, the software or firmware instructions may be stored in any computer readable memory such as on a magnetic disk, an optical disk, or other storage medium, in a RAM or ROM or flash memory, processor, hard disk drive, optical disk drive, tape drive, etc. The software or firmware instructions may include machine readable instructions that, when executed by one or more processors, cause the one or more processors to perform various acts.

When implemented in hardware, the hardware may comprise one or more of discrete components, an integrated circuit, an application-specific integrated circuit (ASIC), a programmable logic device (PLD), etc.

While the present invention has been described with reference to specific examples, which are intended to be illustrative only and not to be limiting of the invention, changes, additions and/or deletions may be made to the disclosed embodiments without departing from the scope of the invention.

What is claimed is:

1. A method for operating an integrated circuit that comprises i) a substrate, ii) current-mode circuitry implemented on the substrate, the current-mode circuitry including a plurality of instances of a translinear circuit, and iii) drive circuitry implemented on the substrate and coupled to the current-mode circuitry, the method comprising:

analyzing the plurality of instances of the translinear circuit to identify any instances of the translinear circuit that are defective;

in response to identifying one or more instances of the translinear circuit that are defective, disabling the one or more instances of the translinear circuit that are defective using one or more respective selection circuits coupled to the one or more instances of the translinear circuit that are defective;

generating, by the current-mode circuitry, the first output using one or more instances of the translinear circuit, including when one or more instances of the translinear circuit are disabled, generating the first output using one or more instances of the translinear circuit that are not disabled, and when no instances of the translinear circuit are disabled, generating the first output using the plurality of instances of the translinear circuit; and generating, by drive circuitry implemented on the substrate and that is coupled to the current-mode circuitry, a second output using the first output of the current-mode circuitry.

2. The method of claim 1, wherein generating the first output comprises:

when only one instance of the translinear circuit is not disabled, generating the first output to correspond to only a single instance of the translinear circuit that is not disabled; and when multiple instances of the translinear circuit are not disabled, generating the first output to correspond to an average of respective outputs of the multiple instances of the translinear circuit that are not disabled.

3. The method of claim 1, wherein generating the first output comprises generating the first output to meet a same set of performance criteria, including:

generating the first output to meet the same set of performance criteria when one or more instances of the translinear circuit are disabled and at least one of the instances of the translinear circuit is not disabled; and generating the first output to meet the same set of performance criteria when no instances of the translinear circuit are disabled.

4. The method of claim 1, wherein:

the current-mode circuitry comprises a current source coupled to the plurality of instances of the translinear circuit;

disabling the one or more instances of the translinear circuit that are defective comprises disconnecting the one or more instances of the translinear circuit that are defective from the current source; and generating the first output comprises distributing a current output by the current source among one or more instances of the translinear circuit that are connected to the current source by one or more respective selection circuits.

5. The method of claim 1, wherein disabling the one or more instances of the translinear circuit that are defective comprises:

controlling, by logic circuitry coupled to the plurality of selection circuit, the plurality of selection circuits to selectively disable respective instances of the translinear circuit.

6. The method of claim 1, wherein the plurality of selection circuits comprises one or more of fuses, antifuses, and electronic fuses (e-fuses) coupled to respective instances of the translinear circuit.

7. A method for manufacturing an integrated circuit, the method comprising:

fabricating current-mode circuitry on a substrate, the current-mode circuitry comprising i) a plurality of instances of a translinear circuit, and ii) a plurality of selection circuits coupled to respective instances of the translinear circuit, each selection circuit configured to selectively disable the respective instance of the translinear circuit, wherein the current-mode circuitry is configured to generate a first output using one or more instances of the translinear circuit that are not disabled by one or more respective selection circuits;

fabricating drive circuitry on the substrate, the drive circuitry coupled to the current-mode circuitry, the drive circuitry configured to generate a second output using the first output of the current-mode circuitry;

determining whether any instances of the translinear circuit, among the plurality of instances of the translinear circuit, are defective; and for each instance of the translinear circuit determined to be defective, controlling the respective selection circuit to disable the instance of the translinear circuit.

8. The method of claim 7, wherein the current-mode circuitry is configured to:

when only a single instance of the translinear circuit is not disabled, generate the first output to correspond to an output of the single instance of the translinear circuit that is not disabled; and when multiple instances of the translinear circuit are not disabled, generate the first output to correspond to an average of respective outputs of the multiple instances of the translinear circuit that are not disabled.

9. The method of claim 7, wherein:

the current-mode circuitry comprises a current source coupled to the plurality of instances of the translinear circuit;

the plurality of selection circuits is configured to selectively connect respective instances of the translinear circuit to the current source; and the current-mode circuitry is configured to distribute a current output by the current source among one or more instances of the translinear circuit that are connected to the current source by one or more respective selection circuits.

10. The method of claim 7, further comprising:

fabricating logic circuitry on the substrate, the logic circuitry coupled to the plurality of selection circuits; and wherein, for each instance of the translinear circuit determined to be defective, the logic circuitry is configured to control the respective selection circuit to disable the instance of the translinear circuit.

11. The method of claim 7, wherein:

the plurality of selection circuits comprises a plurality of fuses coupled to respective instances of the translinear circuit; and controlling, for each instance of the translinear circuit determined to be defective, the respective selection circuit to disable the instance of the translinear circuit comprises, controlling, for each instance of the translinear circuit determined to be defective, the respective fuse to disable the instance of the translinear circuit.

12. An integrated circuit, comprising:

a substrate;

current-mode circuitry implemented on the substrate, the current-mode circuitry comprising i) a plurality of instances of a translinear circuit, and ii) a plurality of selection circuits coupled to respective instances of the translinear circuit, each selection circuit configured to selectively disable the respective instance of the translinear circuit, wherein the current-mode circuitry is configured to generate a first output using one or more instances of the translinear circuit that are not disabled by one or more respective selection circuits; and drive circuitry implemented on the substrate and coupled to the current-mode circuitry, the drive circuitry configured to generate a second output using the first output of the current-mode circuitry.

13. The integrated circuit of claim 12, wherein the current-mode circuitry is configured to:

when only a single instance of the translinear circuit is not disabled, generate the first output to correspond to an output of the single instance of the translinear circuit that is not disabled; and when multiple instances of the translinear circuit are not disabled, generate the first output to correspond to an average of respective outputs of the multiple instances of the translinear circuit that are not disabled.

14. The integrated circuit of claim 12, wherein the current-mode circuitry is configured to generate the first output to meet a same set of performance criteria:

when one or more instances of the translinear circuit are disabled and at least one of the instances of the translinear circuit is not disabled; and when no instances of the translinear circuit are disabled.

15. The integrated circuit of claim 12, wherein:

the current-mode circuitry comprises a current source coupled to the plurality of instances of the translinear circuit;

the plurality of selection circuits is configured to selectively connect respective instances of the translinear circuit to the current source; and the current-mode circuitry is configured to distribute a current output by the current source among one or more instances of the translinear circuit that are connected to the current source by one or more respective selection circuits.

16. The integrated circuit of claim 12, further comprising:

logic circuitry implemented on the substrate and coupled to the plurality of selection circuits, the logic circuitry configured to control the plurality of selection circuits to selectively disable respective instances of the translinear circuit.

17. The integrated circuit of claim 12, wherein the plurality of selection circuits comprises one or more of fuses, antifuses, and electronic fuses (e-fuses) coupled to respective instances of the translinear circuit.

* * * * *